US007479632B1

(12) United States Patent
Gevelber et al.

(10) Patent No.: US 7,479,632 B1
(45) Date of Patent: Jan. 20, 2009

(54) E-BEAM VISION SYSTEM FOR MONITORING AND CONTROL

(75) Inventors: Michael Alan Gevelber, Auburndale, MA (US); Adam Scott Brewster, Brighton, MA (US); Brian Louis Vattiat, Brookline, MA (US)

(73) Assignees: Trustees of Boston University, Boston, MA (US); Cyber Materials LLC, Auburndale, MA (US)

( * ) Notice: Subject to any disclaimer, the term of this patent is extended or adjusted under 35 U.S.C. 154(b) by 457 days.

(21) Appl. No.: 11/341,154

(22) Filed: Jan. 27, 2006

Related U.S. Application Data

(60) Provisional application No. 60/648,776, filed on Feb. 1, 2005.

(51) Int. Cl.
*H01J 37/30* (2006.01)
(52) U.S. Cl. .................. 250/307; 250/306; 250/310; 250/311; 250/492.1; 250/492.3
(58) Field of Classification Search .............. 250/306, 250/307, 310, 311, 396 R, 492.1, 492.2, 492.3
See application file for complete search history.

(56) References Cited

U.S. PATENT DOCUMENTS 4,226,540 A * 10/1980 Barten et al. ............... 356/445
5,229,570 A * 7/1993 Kaufmann et al. ...... 219/121.28
5,561,696 A * 10/1996 Adams et al. ................. 378/58
5,621,811 A * 4/1997 Roder et al. ................ 382/147
5,736,073 A * 4/1998 Wadley et al. ................ 264/10
5,772,758 A * 6/1998 Collins et al. ................ 117/85
6,436,466 B2 * 8/2002 Bahr et al. ..................... 427/8
7,152,549 B2 * 12/2006 Malischke ............ 118/723 EB
2003/0201393 A1 * 10/2003 Tsuneta et al. .............. 250/311
2005/0242286 A1 * 11/2005 Watanabe et al. ........... 250/310
2006/0043982 A1 * 3/2006 Shinada et al. ............. 324/751
2006/0267968 A1 * 11/2006 Straka et al. ................ 345/204

\* cited by examiner

*Primary Examiner*—Jack I Berman
*Assistant Examiner*—Michael J Logie
(74) *Attorney, Agent, or Firm*—James Marc Leas

(57) ABSTRACT

A method of characterizing an electron beam is described, comprising providing a system including an electron gun having a steering coil. A material having a surface is also provided. An electron beam from said electron gun is directed to said surface. The directing includes providing a first current to the steering coil to direct the electron beam to a first point on the surface and then providing a second current to the steering coil to direct the electron beam to a second point on the surface. An imaging system is mounted for viewing said surface. An image is collected based on light emitted from the surface because of the electron beam directed at the first point and the second point. A light intensity is determined at the first point and at the second point.

31 Claims, 10 Drawing Sheets

ID-BEAM VISION SYSTEM FOR
MONITORING AND CONTROL

RELATED APPLICATIONS

This application claims priority of provisional application 60/648,776 filed Feb. 1, 2005, incorporated herein by reference.

This invention was made with Government support under contract number DMI-0339988 awarded by the National Science Foundation. The Government has certain rights in the invention.

FIELD

This application generally relates to a method of evaporating a material. More particularly, it relates to a method of evaporating a material with an electron beam. Even more particularly, it relates to a method of evaporating that includes a vision system and feedback for enhanced evaporation.

BACKGROUND

E-beam deposition systems use a focused beam of electrons to heat a small area of material to be evaporated in a crucible. Currents in x and y electromagnetic coils are varied to steer the electron beam and to modulate the position it strikes the surface of the material in the crucible (referred to as the "melt surface" even if a solid material in the crucible sublimates). Continuous scanning of the melt surface by the electron beam is used to evenly heat the melt surface and thus uniformly deplete the feedstock material as it evaporates.

SUMMARY

One aspect of the present patent application is a method of characterizing an electron beam. The method includes providing a system including an electron gun having a steering coil. A material having a surface is also provided. An electron beam from said electron gun is directed to said surface. The directing includes providing a first current to the steering coil to direct the electron beam to a first point on the surface and then providing a second current to the steering coil to direct the electron beam to a second point on the surface. An imaging system is mounted for viewing said surface. An image is collected based on light emitted from the surface because of the electron beam directed at the first point and the second point. A light intensity is determined at the first point and at the second point.

Another aspect is a method of operating an electron beam. The method includes providing a system including an electron gun having a steering coil. A material having a surface is also provided. An electron beam is directed from the electron gun to the surface. An imaging system is mounted for viewing the surface. An image based on light emitted from the surface because of the electron beam is collected. Real time feedback from the imaging system to control deposition rate by adjusting electron flux to more closely match a desired image is provided.

Another aspect is a method of operating a system. The method includes providing a system having an adjustable input parameter. The surface has a measurable output parameter. Adjusting the adjustable input parameter adjusts an operation of the system on the surface. The output parameter is related to intensity of light emitted by the surface. A camera is provided for observing the surface. An image of the surface is collected with the camera based on light emitted by the surface. Intensity level of light in the image is determined. The input parameter is adjusted based on the intensity.

BRIEF DESCRIPTION OF THE DRAWINGS

The foregoing will be apparent from the following detailed description as illustrated in the accompanying drawings, in which.

DETAILED DESCRIPTION

Figure 1:
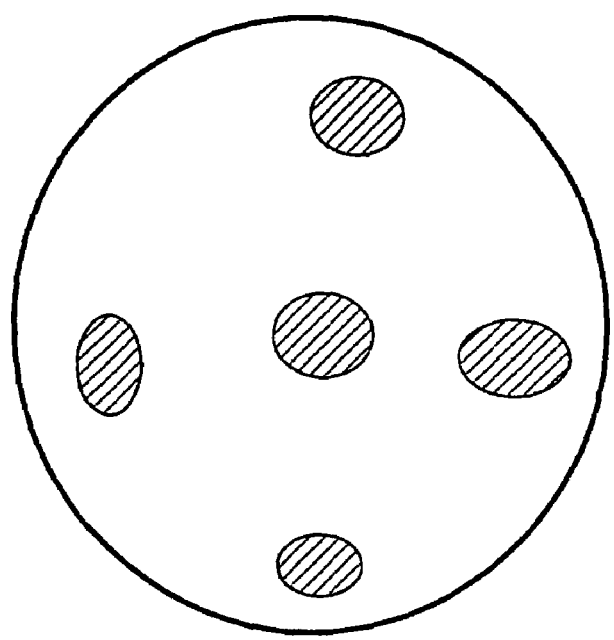
FIG. 1 is a composite photograph including images at the center and at four steering current limits for an actual experiment.

The present inventors found that maintaining a uniform flux of electrons over the melt surface is particularly important for materials that sublimate instead of melting, such as silica, because thermal conductivity may not be high enough to otherwise maintain a uniform temperature distribution and a uniform sublimation. Using a video camera they observed variations in electron beam power and position even using current state-of-the-art equipment during production runs, from run to run and from system to system for identical system inputs. These variations in electron beam power and position lead to variations in evaporation, which leads to variation in deposition rate, coating thickness, and coating quality. They then developed a system that can detect these variations and that can provide electron beam sweep patterns that overcome the variations and achieve more uniform melt surface heating.

The present patent application describes a technique to directly monitor the area, position, and intensity of heating by the electron beam in the crucible of feedstock material. This quantitative information can then be used as a tool for process monitoring, as a signal for feedback control operation, and as tool for developing beam sweep patterns. The inventors found that they could accomplish these tasks by imaging the thermal radiation emitted by the feedstock material with a video camera and then analyzing the image information with a specially designed computer algorithm to adjust the sweep pattern.

One way to implement the camera system is by using a CMOS or CCD-array digital video camera linked to a computer by IEEE-1394 communication protocol. The digital video camera measures a range of thermal radiation wavelengths emitted by the heated feedstock material and transmits a two dimensional mapping of light intensity to a computer where the image is processed by an algorithm written in National Instruments LabView program code. The algorithm is further described herein below. The wavelengths are in the infra red or visible.

Due to the geometry of typical electron beam vacuum chambers, the camera may view the crucible and the melt surface at a non-normal angle defined by the location of the view port with respect to the crucible. A geometric calibration fixture temporarily mounted on the crucible may be imaged by the camera. The perspective distortion is then calculated by a subroutine implemented in the computer algorithm which compares the positions and distances between geometric features scribed on the fixture as measured by the camera to the actual positions and distances between those features on the fixture itself. Once the calibration procedure is completed, subsequent images are distortion-corrected to provide accurate measurement of beam position and size.

Since the range of light intensity emitted by the feedstock material typically exceeds the dynamic range capability of most digital video cameras the integration time, or exposure, of the active element is dynamically controlled by the computer, which monitors a CCD array voltage and adjusts the integration time. This enables measuring the absolute intensity of light emitted over a wide dynamic range without relying on moving parts, such as an iris mechanism in the video camera's optics, and the need to calibrate for such movement.

Measurement of intensity is also facilitated by use of an intensity calibration light source that produces a constant light intensity, which is measured by the camera. Thus, the system can correct for variation in absorption and reflection of light at the view port as material is deposited. The calibration source can be placed inside the vacuum chamber and its intensity measured directly. Or it can be positioned outside the chamber and set to reflect off of some feature inside the chamber. In the case where the calibration source is used outside the chamber, the losses due to the view port would be doubled. A surface in the chamber reflecting light could be protected from receiving coating by a shutter to keep the light intensity constant. Reduction in intensity of the calibration source will then be a measure of window coating that attenuates the emitted light intensity as well.

The intensity and color of thermal radiation emitted by a material varies with the temperature of the material. The present inventors found that measuring the intensity of the thermal radiation emitted by the melt surface as measured by the imaging system provided a good measure of the temperature of the feedstock material at each point on its surface. Alternatively, the radiation spectrum could be used to determine the temperature distribution across the melt surface.

The evaporation of feedstock material occurs as a result of the heating of the melt surface by the electron beam. The rate of evaporation is proportional to the area of heated material and to the temperature of that area. Using the imaging system the inventors found that the rate of evaporation is proportional to the surface area of material emitting light with intensity greater than some threshold level of intensity.

The present inventors found that the centroid position is related to the position of the electron beam. The centroid position or center of mass of light intensity, is calculated by finding the average of the sum of positions measured at points across the image weighted by intensity at each position. The present inventors found that by measuring the centroid position they also determined the actual location of the electron beam and could use the vision system to directly control the position of the electron beam regardless of variations in the of the effect of the x and y beam steering electromagnetic coils. Thus, despite non-linear variations in the e-beam deposition system, optically determining the centroid position of emitted light allowed determining the actual e-beam position. It also allowed controlling the e beam to steer the centroid position to a desired position across the melt.

While centroid of the emitted light intensity is one measure of beam position that can be used, beam location can also be defined by location of peak intensity, the average x and y location of all points above a threshold intensity, fitting a circle or ellipse to the intensity pattern, or boundary points of the fitted circle or ellipse or center of the fitted circle or ellipse.

One use for the correlation of emitted radiation intensity centroid with beam location is for calibration of the x and y beam steering coils. In the calibration, coil current is adjusted to deflect the beam to its maximum extent in each direction and the radiation intensity centroid, which provides the actual position of the beam at the melt surface, is measured, providing a mapping between coil current and beam position. An operator can then use this information to create beam sweep patterns or the information could be used as feedback to a sweep pattern generator.

The present patent application overcomes one of the major problems with evaporation systems, the variation in the relationship between steering current in the steering coils and amount of beam deflection. The solution provided by this application improves a system's ability to evaporate material in a consistent and predictable manner.

A composite of the five images during an electron beam calibration procedure are shown in FIG. 1, where coil current is adjusted to deflect the electron beam to the front, back, left, and right edges of the crucible and to the center of the crucible.

The apparatus of the present patent application was used to capture the image, correct the image for geometrical distortion, determine the intensity at each point in the image based on the calibration with the constant light source, calculate the centroid position, the intensity at the centroid position, and the area above an intensity threshold in real time. The image data and analysis data were recorded to a computer file for later analysis and review. FIG. 1 illustrates the variation in e-beam intensity and area of the beam depending on beam position. An operator could use this information to adjust electron beam power and sweep patterns to more uniformly heat the melt surface or the data could be used in a feedback controller to automatically adjust beam power and position.

Figure 2:
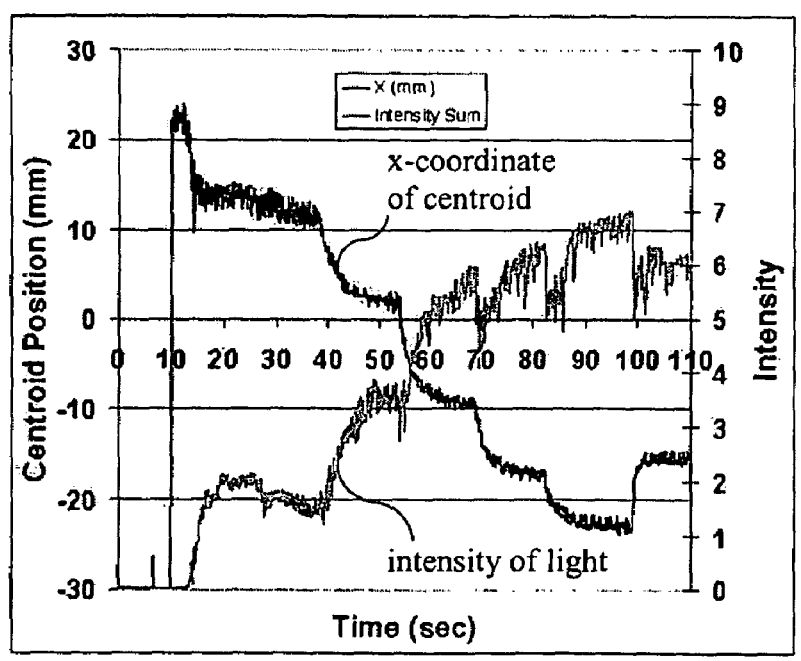
FIG. 2 shows the centroid x-position and intensity of light emitted by heated feedstock material during a preprogrammed beam sweep pattern.

An example of varying centroid position and measuring intensity data recorded during an experiment is shown in FIG. 2. The emitted light intensity varied substantially as the x coordinate of the centroid position was changed as the e-beam under constant power was steered across the melt surface. The intensity was constant for the first two centroid positions, then varied considerably with centroid position on the melt surface for the next two centroid positions and then varied less for the last four centroid positions. This data is indicative of the change in electron beam focus as the beam sweeps across the melt surface. The present patent application provides a way to overcome this variation and obtain a more uniform intensity distribution or a desired intensity distribution and more uniform evaporation across the melt surface.

The system is particularly useful to overcome the nonlinear mapping of coil currents to the actual beam position and beam focus on the melt surface. In the current state of the art, current is varied in the x and y coils to steer the electron beam so the electrons scan across the melt surface. The variation in current in the coils changes the magnetic field the electron beam experiences varying its deflection. A commonly used calibration strategy has been to first experimentally determine the coil currents that drive the beam to the four limits of the crucible, the top, bottom, left and right sides. To drive the beam to other locations on the melt surface, these values have been interpolated. In some cases, a coil current is also established for a center position, in order to improve interpolation.

Figure 3:
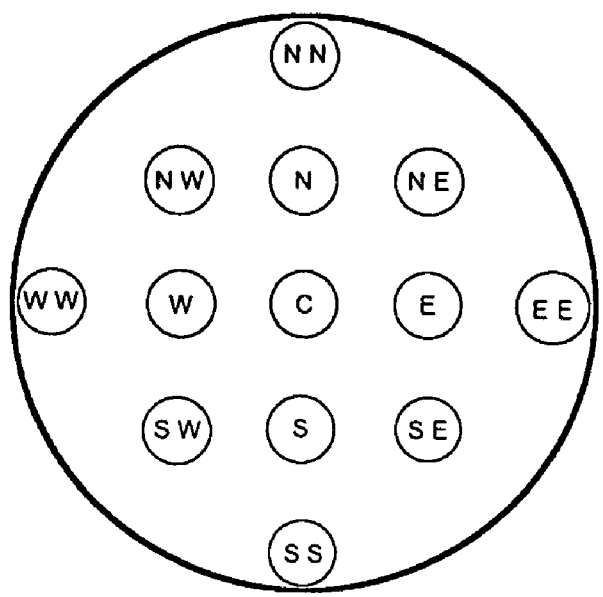
FIG. 3 shows desired locations of the electron beam as specified in a programmable sweep controller, which corresponds to the interpolated coil currents determined from the steering current limits.
Figure 4:
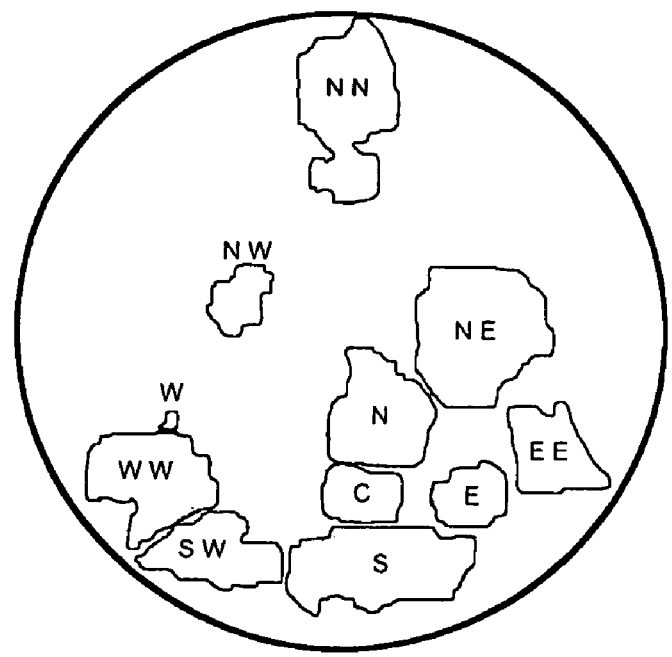
FIG. 4 shows the actual beam locations and the wide variations in beam intensity in an actual experiment in which the variation from the desired locations illustrates the nonlinearities of the e-gun system.

As shown in FIGS. 3 and 4, specification of a coil pairing based on an interpolation of the beam limits does not result in a uniform mapping of the actual beam position. This error is due, in part, to the nonlinear magnetic field and other nonlinear interactions. Here FIG. 3 shows the desired beam location s as specified on a programmable sweep controller, an Eddy XYC-10. The actual composite of intensity images of the resulting beam locations on the melt surface are shown in FIG. 4 and indicate the actual beam locations and resulting intensity distribution of the melt surface is very different from the ideal.

In addition, the beam focus is also highly nonlinear and not uniform across the melt surface due to variations in the magnetic field. This is seen in FIG. 4 by the different intensity levels and areas of the intensity patterns. In the experiment, the beam power was held constant. The wide variation in intensity distribution, illustrates the different temperature distributions achieved by electron beam in the different locations.

The present patent application provides a way to overcome these unwanted non-linear variations in beam location and beam focus by determining a sweep pattern that compensates for them to achieve a desired intensity distribution and heating of the melt surface. The vision system is first used to determine the actual nonlinear variations for a particular e-gun system and then this information is used to determine the appropriate sweep pattern. The system provides an automatic way to determine the four beam limit currents based on the centroid position of the actual optical intensity distribution obtained with the vision system. The inventors recognized that this is difficult for an operator to do due to the high intensity of the emitted light and typically poor viewing conditions provided to an operator and is much better achieved with the vision system of the present patent application. The vision system is also used to recognize a drift of the sweep pattern and a determination that the e-gun system has aged and the filament needs to be replaced, or another change in deposition conditions, either of which may require a new sweep pattern to be designed or other maintenance.

Figure 5:
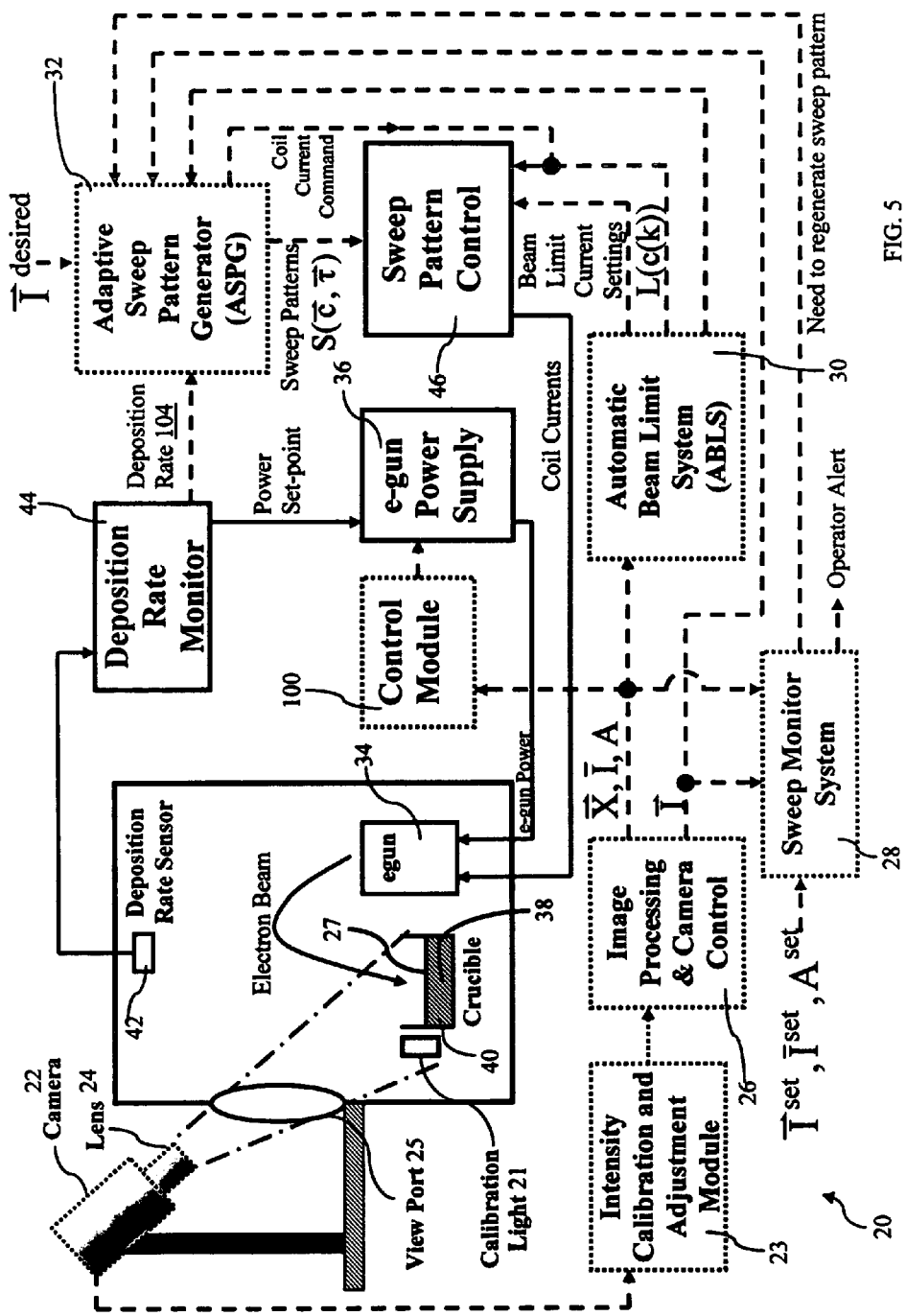
FIG. 5 is a schematic block diagram of the E-beam Vision System for Monitoring and Control including major modules.

A block diagram of electron-beam vision system 20 used to monitor the drift of the e-beam process, provide data to develop new e-beam sweep patterns, and determine the appropriate beam limits used in those sweep patterns, is shown in FIG. 5. Camera 22 having optics 24 directed through view port 25 collects an image in which light intensity varies across an array of pixels within camera 22. Data from this array of pixels includes an intensity measurement for each pixel, and this data is provided as a vector to image processing module 26. The data is converted into digital data in image processing module 26. The data can then be used by the other components of vision system 20 to automatically design the sweep pattern, determine the beam limits, and provide monitoring capability that determines when the sweep pattern has drifted and there is either a need for the operator to take corrective action, or the sweep pattern to be redesigned.

Data processing in image processing module 26 includes: (a) receiving the vector, $\bar{I}$, (or other suitable form, such as an array) of intensity data from camera 22, (b) calculating the average intensity, $\bar{I}$, (c) calculating the area of the pixels having an intensity above a specified intensity threshold, A, and (d) calculating the centroid position from the intensity data, which is similar to calculating the location of the center of mass of the intensity image. The centroid position can be provided in coordinates relative to a melt surface frame of reference or to some other suitable reference frame.

Image processing and camera control module 26 also provides automatic adjustment of integration time to adjust for different light levels emitted by the evaporating material, determination of measurement angle and adjustment of image projection to determine the appropriate surface area of melt surface 27, automatic adjustment of camera focus, and automatic determination of view area to maximize the mapping of appropriate melt surface 27 in terms of the area viewed by camera 22, using subroutines available in standard LabView vision software. Intensity calibration and adjustment module 23 also provides automatic adjustment in view of changes in intensity measured from intensity calibration light source 21.

Image processing and camera control module 26 sends data to sweep monitor system 28, automatic beam limit system (ABLS) 30, and the adaptive sweep pattern generator (ASPG) 32. Data outputs of 26 include centroid position $\bar{x}$, average light intensity $\bar{I}$, total light intensity I (i.e. a sum of intensities for all pixels), and intensity distribution. Sweep monitor system 28 monitors whether the intensity distribution is changing beyond desired limits, indicates whether an operator should provide maintenance, or whether a new sweep pattern should be developed or the existing pattern should be refined. The inputs to sweep monitoring system 28 include the data outputs from image processing and camera control system 26 as well as the values desired for each point during the normal operation of the sweep pattern. The sweep pattern can be developed or refined either manually, or through ASPG 32. Maintenance may include changing electrodes, re-gaussing the e-gun magnets, providing new beam limits, either manually by the operator, using the image processing system to provide a quantifiable measure of beam position, or by using ABLS 30.

Current is supplied to electron gun 34 by power supply 36. Evaporation from surface 27 of material 38 in crucible 40 is monitored by deposition rate sensor 42 connected to deposition rate monitor 44. Typically, a quartz crystal is used to measure deposition rate.

Figure 6B:
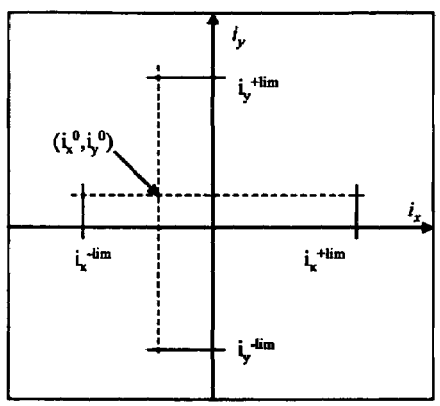
FIG. 6b illustrates the coil currents used in determining beam limits.
Figure 6C:
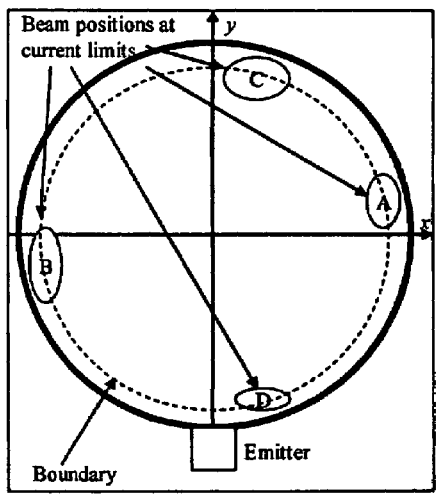
FIG. 6c shows the beam location on the melt surface using the process of FIG. 6a and the coil currents of FIG. 6b.

Typically, sweep pattern controller 46 requires a specification of the current in each coil of e-gun 34 that correspond to the four beam limits, corresponding to the top, bottom, left, and right positions of a circular crucible. Currents at a center position may also found in order to provide a more accurate basis for interpolation. In the present patent application, ABLS 30 determines currents at these beam limits by adjusting coil currents with sweep pattern control until the beam is driven to the desired points on the melt surface, and those currents are recorded in memory associated with image processing a camera control 26. Centroid position of emitted light distributions obtained by camera 22 are calculated in image processing and camera control system 26. Coil current is adjusted based on commands from ABLS 30 to sweep pattern controller 46 until the four or five points are determined and the corresponding coil currents are recorded, as outlined in the flow chart in FIG. 6a and illustrated as the coil current flow in FIG. 6b and the corresponding beam movement in FIG. 6c. Areas A and B are off axis in FIG. 6c because of e-gun nonlinear distortions. FIG. 6c illustrates that merely adjusting the current exclusively in the x coil does not necessarily produce a beam movement only along the x axis; FIG. 6c shows a y component of this movement as well.

Figure 7:
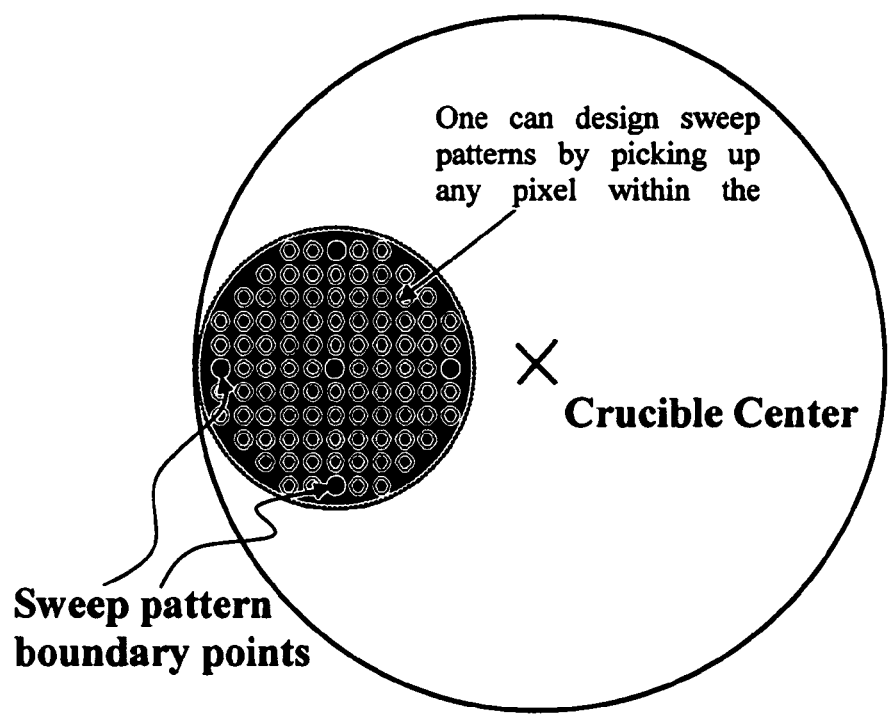
FIG. 7 is a schematic diagram illustrating the 5 boundary points defining a portion of the material and the coordinate frame of the sweep patterns for a large crucible.

FIG. 7 shows the use of beam limit points for setting the beam limits for sweeping across a portion of a large crucible. Other portions may not be used.

Several other measures of beam position can be used in the ABLS 30 process of determining beam limits. Besides determining the centroid of an intensity pattern, one might also define the beam location by other metrics including one or more of the following: 1) location of peak intensity, 2) the average x and y location of all points above a threshold intensity, 3) fitting of a circle or ellipse to the intensity pattern, or 4) boundary points of the fitted circle or ellipse or center of the fitted circle or ellipse.

ASPG 32 determines a sweep pattern to meet the user's desired intensity profile over melt surface 27 or some portion of melt surface 27 in view of data from camera 22. The sweep pattern is a sequence of coil currents $c_j$ supplied to the e-gun coils to steer the electron beam to a sequence of points on the melt surface. The sweep pattern also includes the time, $\tau_j$, the coil currents $c_j$ are held for each setting of coil currents. The sweep pattern also includes the sweep frequency, which is how often the sweep pattern controller runs through a sequence of coil currents and starts over.

Sweep patterns are implemented in the current state of the art by commercially available programmable sweep pattern controller 46, such as Telemark's Programmable x-y sweep, Telemark, Fremont, Calif. which allows a user to program sweep patterns, including an array of coil currents, dwell times for each coil current, and sweep frequency. Each coil current provided by programmable sweep pattern controller 46 includes a pair of x and y coil currents. The user can program these sweep controllers through digital communication over an RS-232 line. The user can program other sweep controllers by setting voltage levels specifying coil currents for both the x and y coils, dwell times, and sweep frequency. The output of ASPG 32 includes the sweep pattern to be executed by sweep pattern controller 46.

The sweep pattern is generated by the ASPG 32 using multiple steps including an experimental step in which each coil current is held for an extended time to obtain a stable intensity image for that coil current. ASPG 32 experimentally maps out this input/output relation including coil current/resulting intensity for the specific e-gun system by sequentially storing the intensity image that corresponds to each pair of coil currents. This mapping is stored as matrix G.

This mapping G is used to determine the dwell times for an initial sweep pattern design. The ASPG 32 algorithm can also modify or adapt this initial sweep pattern design based on the measured intensity image that is achieved when this sweep pattern is implemented. Two different adaptation schemes are outlined in FIGS. 8 and 9.

Before the beam mapping step is done, to insure that e-beam remains within the crucible, the four extreme values of current are determined. Automatic Beam Limit System (ABLS) 30 implements an algorithm that automatically determines these four maximum coil currents that are used in sweep pattern controller 46 from data collected by camera 22 as it monitors the region of the melt surface emitting light. The algorithm keeps current in one coil completely off as it varies the current in the other coil until the beam is observed at the edge of the crucible, and this current is recorded. So a total of four numbers, two for each coil, specify the maximum beam limits and the corresponding maximum coil currents. To also determine the coil current pair corresponding to the center of the crucible the ABLS 30 also includes an algorithm to determine these two numbers.

For each e-gun there will be different beam limits stored in sweep controller 46. Controllers with 4 degrees of freedom (4-DF controllers) allow the user to set the four maximum coil currents for each of the sweep coils independently ($i_x^{-lim}$, $i_x^{+lim}$, $i_y^{-lim}$, and $i_y^{+lim}$). Controllers with 6 degrees of freedom (6-DF controllers) allow the user to further specify the currents that cause the beam to hit the center of the melt surface ($i_x^0$, and $i_y^0$).

Figure 6A:
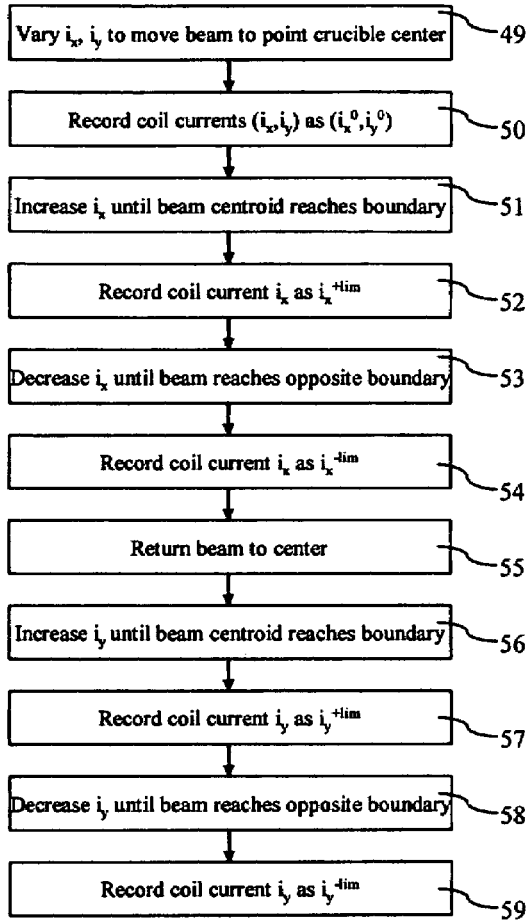
FIG. 6a is a flow chart illustrating how the automatic beam limit system determines the coil currents that achieve the desired beam limits.

The algorithm for calibrating a 6-DF controller is shown in FIG. 6a. First, the beam is centered by adjusting $i_x$ and $i_y$ independently, as shown in box 49. When the beam is as close as it can be to the center of the melt surface, the currents $i_x$ and $i_y$ are stored as $i_x^0$ and $i_y^0$ as shown in box 50. These two steps are skipped for 4-DF controllers.

Next, for all controllers, the current limits are set. With $i_y$ still set to $i_y^0$ (or current off for 4-DF controllers), $i_x$ is slowly increased until the centroid of the emitting region approaches a user-defined boundary, normally around 1 cm from the melt surface edge, as shown in box 51 and as position A in FIG. 6c. The coil current $i_x$ is then saved as $i_x^{+lim}$, as shown in FIG. 6b, and the beam position is saved as ($x^{x+lim}, y^{x+lim}$) which corresponds to beam position A. The beam is then returned to the center of the melt surface. The process is repeated in the same manner for the other three beam limit settings, as shown in boxes 52-59 of FIG. 6a.

Adaptive Sweep Pattern Generator (ASPG) 32 uses three steps to design a sweep pattern, which includes coil currents and dwell times (the frequency can be separately specified). In the first step, the System ID step, the ASPG 32 carries out a series of beam mapping experiments to determine the response of the e-gun to different combinations of sweep coil currents, as described herein above. This information is stored in the matrix G. In the second step, Sweep Pattern Calculation, the G matrix is combined with a desired intensity distribution provided by the user to produce dwell times for an initial sweep pattern that will result in a intensity distribution close to that specified by the user. In the final step, Adaptation, the sweep pattern is refined to correct for nonlinearities of the e-gun system by observing the actual intensity distribution obtained by implementing the initial sweep pattern and then using the G matrix to make small adjustments in the dwell times.

An alternate adaptation scheme builds a refined matrix $G^P$ based on data from running the initial sweep pattern design. The refined matrix $G^P$ also includes other effects that may be present to provide a more accurate input/output mapping.

Figure 8:
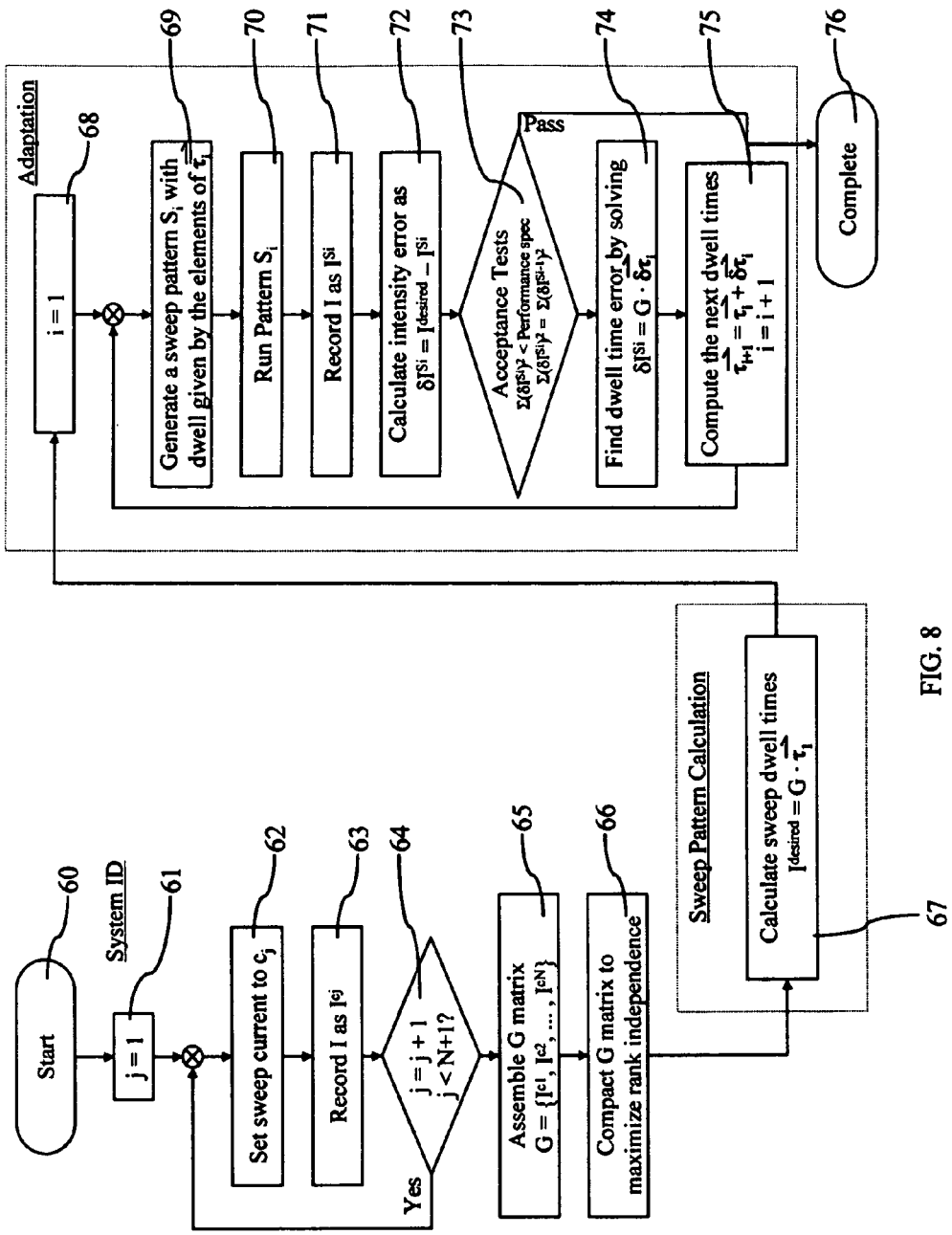
FIG. 8 is a flow chart that describes how the adaptive sweep pattern generator system determines a sweep design that best achieves the desired intensity distribution based on observations obtained from the image processing system.

When the System ID step begins, as shown in box 60 of FIG. 8, the ASPG 32 has a vector, $\vec{c}$, of all possible sweep coil current combinations arranged in the order in which the sweep controller can most efficiently sequence them. This vector $\vec{c}$ will later be paired with a dwell time vector, $\vec{\tau}$, which specifies the amount of time that the e-gun remains focused at each point to form a complete description of a sweep pattern.

For each element $c_j$ in the vector $\vec{c}$, starting with its first value in box 61, the sweep controller is instructed to set the coil currents to those described by $c_j$, as shown in box 62, and the resulting intensity distribution in the melt surface is captured by the camera and stored in a column vector $\bar{I}^{c_j}$, as shown in box 63. Then the next coil current value is selected and the process is repeated as shown in decision box 64. Note that a deposition rate controller is preferably not used for this process, and emission currents are set to a low value compared to those used in an actual deposition because during this system ID experimental step the beam will not be moving. The resulting intensity distribution vectors $\bar{I}^{c_j}$ are assembled to form System ID matrix G as shown in box 65.

In some cases an e-gun may provide similar electron beam intensity distributions for multiple coil current pairs. Only one of these coil current pairs is retained. This step will improve the rank independence of matrix G. The G matrix is compacted by removing any column which is not sufficiently distinct from all other columns as shown in box 66. Corresponding elements in the vector $\vec{c}$ are also removed.

In the Sweep Calculation step, the System ID matrix G is used with the desired intensity distribution, given by the user in the form of a column vector, $\bar{I}^{desired}$, to solve for the sweep dwell times, as shown in box 67, by solving the matrix equation $$\bar{I}^{desired} = G \cdot \vec{\tau}_1$$

Where the vector, $\vec{\tau}$, represents the first solution of the dwell times $\tau_i$ for coil current $c_i$.

A number of well known numerical techniques can be used to solve the matrix equation, including inverting the matrix, LUD decomposition, and SVD decomposition. Note that when matrix G is not invertible, this equation can be solved by least-squares matrix technique or other standard methods to determine $\vec{\tau}_1$, the dwell times associated with the first sweep pattern. These dwell times are combined with the vector $\vec{c}$ to form the first sweep pattern $S_1 = (\vec{c}, \vec{\tau}_1)$.

After the first sweep pattern, with its coil currents and its dwell times, is created, as shown in boxes 67-69, the sweep pattern can be improved by using the G matrix and experimental results from running the first sweep pattern on the e-gun as shown in boxes 70 and 71. For any sweep pattern $S_i$ with dwell times given by $\vec{\tau}_i$ and a measured intensity distribution given by $\bar{I}^{S_i}$, the difference between the desired intensity distribution and the measured intensity distribution as shown in box 72, is $$\delta \bar{I}^{S_i} = \bar{I}^{desired} - \bar{I}^{S_i}$$

This information is used with the G matrix to calculate the necessary changes in dwell time, as shown in box 74, by solving this equation for $\delta \vec{\tau}^{S_i}$ (again using a least-squares or other appropriate technique).

$$\delta \bar{I}^{S_i} = G \cdot \delta \vec{\tau}^{S_i}$$

The dwell time correction is then applied, as shown in box 75, and a new sweep pattern is created.

$$S_{i+1} = (\vec{c}, \vec{\tau}_i + \delta \vec{\tau}^{S_i})$$

The adaptation process is repeated until a user specified termination condition is met as shown in decision box 73.

Termination conditions may include absolute performance objectives as measured by $\Sigma(\delta \bar{I}^{S_i})^2$ ("this pattern is good enough, stop trying to improve it"), or performance improvement in each iteration as measured by $\Sigma(\delta \bar{I}^{S_{i-1}})^2 - \Sigma(\delta \bar{I}^{S_i})^2$ ("the pattern doesn't meet the first performance specification, but successive iterations are not improving it"), as shown in box 76.

Another method of improving the sweep pattern is similar to the first, but the alternate method generates a new matrix, $G^P$, which is similar in form to the original matrix G but is calculated from intensity distribution vectors resulting from perturbing an actual sweep pattern, so it will better reflect the dynamics of the system, including inductance of the magnetic sweep coils, interactions between the two magnetic fields, and fields induced by the electron beam itself.

The first step of the alternate adaptation process is experimentally run the initial sweep pattern design and record the intensity data, as shown in boxes 80-82. Then the dwell time vector $\vec{\tau}^{P_0}$ of the initial sweep pattern has one of its values changed, as shown in boxes 83-84 to generate N linearly independent perturbance vectors $\delta \vec{\tau}^{P_1}, \delta \vec{\tau}^{P_1}, \ldots, \delta \vec{\tau}^{P_N}$ (where N is the number of coil current combinations=the length of $\vec{c}$), and adding them to the base dwell time vector to come up with the perturbed dwell time vectors. Each perturbed dwell time vector has a different dwell time for one coil current pair.

$$\vec{\tau}^{P_i} = \vec{\tau}^{P_0} + \delta \vec{\tau}^{P_i}$$

As shown in box 85, the perturbed sweep patterns are then formed by combining the dwell time vectors with the coil current vector $$S^{P_i} = (\vec{c}, \vec{\tau}^{P_i})$$

The intensity distribution column vectors $\bar{I}^{S^P_i}$ for each perturbed pattern are gathered in the same way as the intensity distribution column vectors were gathered in the System ID step 65, however the $G^P$ is not computed in the same manner as the G matrix was there. The sweep patterns used are created from linearly independent perturbations, with only one dwell time changed for each vector. The perturbed sweep pattern is run on the e-gun and the corresponding intensity distribution is recorded, as shown in box 86. However, it is desirable to record the difference from the initial intensity distribution, as shown in box 87 in which the matrix $G^P$ is calculated as the matrix of intensity difference vectors with the initial distribution subtracted out. Remaining steps 88-96 are identical to steps 68-76 of FIG. 8 but in this case we are using the perturbation matrix $G^P$.

The real-time monitoring of the system can be used to indicate to the sweep adaptation system that the sweep pattern should be changed to compensate for process or equipment variation. If this occurs while a process is running, the adaptive sweep system can be used in a real-time fashion, in that the adaptation can be performed based on the algorithm of FIG. 8 including steps 68 through 76 using the G matrix calculated previously in steps 61 through 66. This can be done in several fashions including temporarily stopping the process to re-calculate the sweep pattern as well as recalculating the sweep pattern while the process is running.

Figure 9:
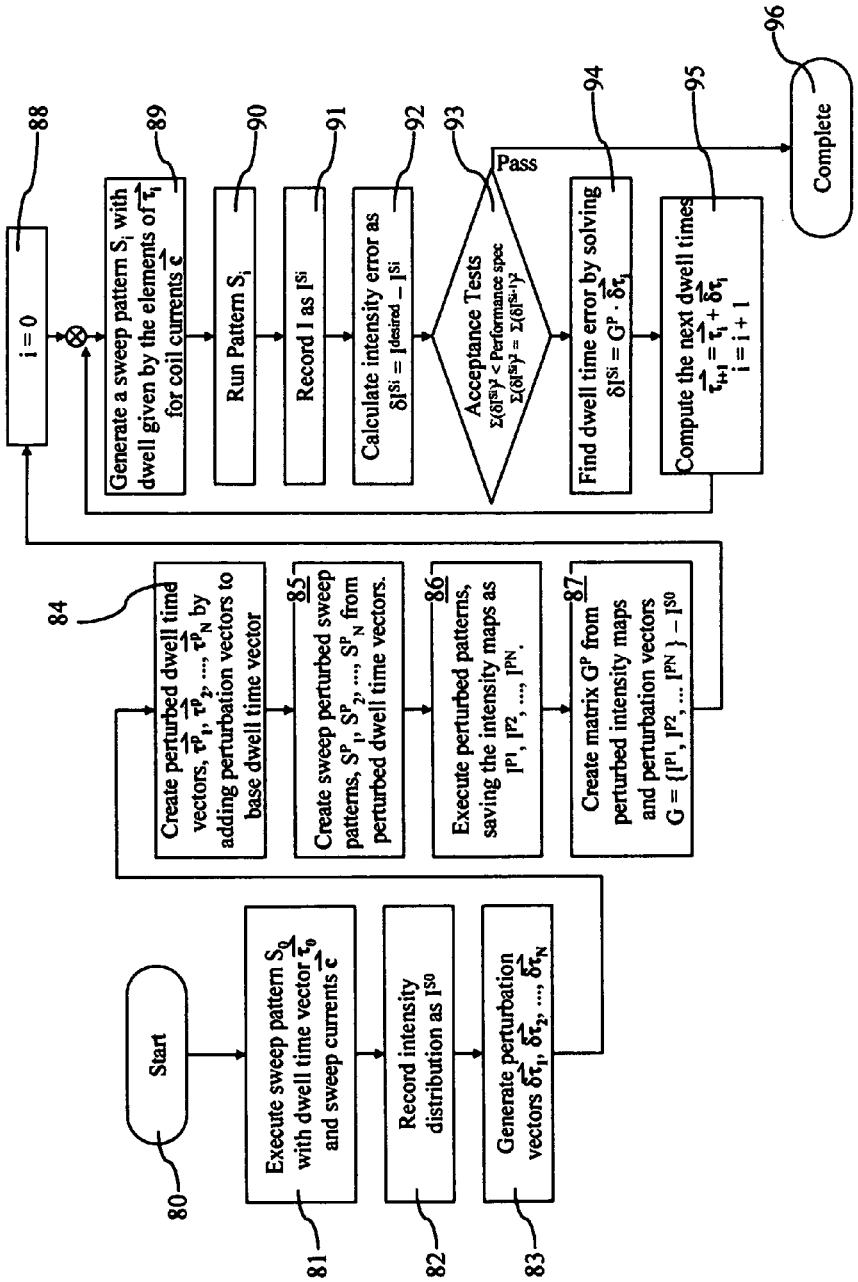
FIG. 9 is a flow chart that describes an alternative adaptation scheme for improving the initial sweep design based on experimental observations obtained from the image processing system.

While the measurement of the melt surface intensity distribution can be used in the sweep generation schemes of FIG. 8 and FIG. 9, measurements of the surface temperature distribution can also be used. Temperature distributions of a surface can be obtained from other thermal imaging systems that determine the temperature distribution across a surface.

In the current state of the art, the e-gun power level can be adjusted to control the deposition rate in real time based on feedback signal from a quartz crystal used to measure the deposition rate. Disadvantages of that scheme are overcome with the teachings of the present patent application which allows the emitted light intensity signal to be used in place of, or in addition to, the measurement of deposition rate as the basis for adjusting the E-gun power level. The present application is particularly useful when a quartz crystal sensor is not practical to use, such as in during a long deposition run for a very thick coating or in continuous, or semi-continuous operations such as web coaters, or when there is value in measuring and tuning the power level when the shutter is closed over the crucible, or when the deposition rate can not otherwise be measured.

Figure 10A:
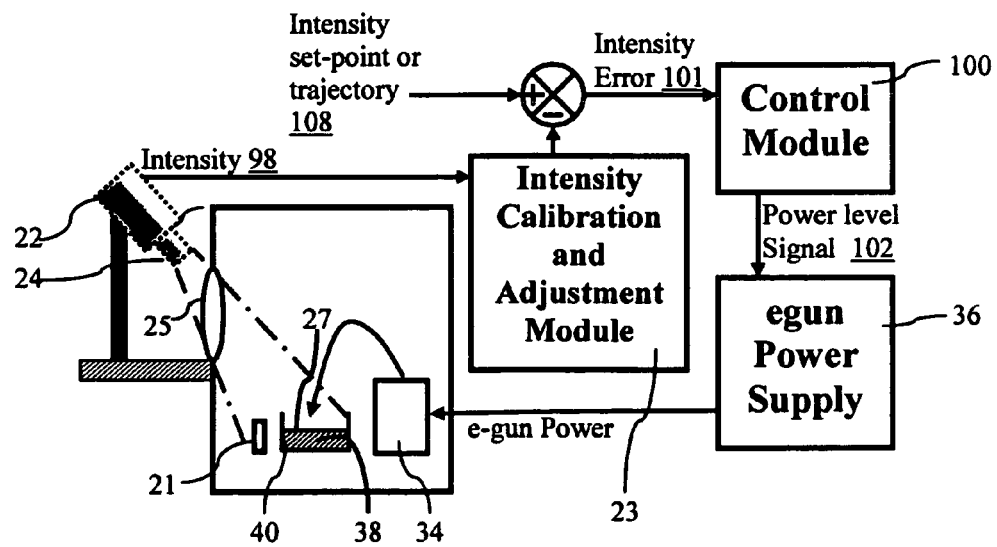
FIG. 10a is a schematic block diagram of the E-beam vision system intensity signal used for real-time feedback to directly control the e-gun power.

Implementation of such as system is shown in FIG. 10*a* where the intensity signal 98 is fed back to control module 100, and an error signal 101 is determined that is the difference between the desired intensity level trajectory or set point 108 and the measured emitted light intensity signal 98. Here, the desired intensity trajectory 108 is a time varying specification of the desired intensity signal. Error signal 101 is then sent to control module 100, which could be a PID controller or other suitable control device or filtering algorithm, which determines the power level signal 102 that should be sent to the electron beam power supply with the objective of making the error signal 101 as small as practicable. This system can be implemented totally in software, such as using the LabView software system, or as a combination of software and separate control module 100. Digital communications, such as over an RS 232 digital interface or analog communications, such as with an analog signal varying from 0 to 10 volts, can be used.

To compensate for reduction in intensity level due to coating of the view port 25, a intensity calibration and adjustment module (ICAM) 23 could be used to ensure that the absolute intensity is determined (FIG. 10*a*). The calibration light source 21 could be located inside the chamber, under a movable shutter to prevent the calibration source from being coated when not being used for calibration. When the calibration shutter is opened, the measured intensity would be used by the ICAM 23 to calculate a calibration factor that would correct the measured intensity level 98 to correspond to the correct absolute intensity of light emitted at the crucible 40. This factor could be applied when using the intensity as a feedback signal for e-gun power.

Several alternative camera based intensity signals could be used in implementing this real time control system including the measured intensity sum for each pixel of the melt surface by the vision system, the intensity sum of pixels above a threshold level, or a normalized intensity signal. Normalization intensity signals could be formed from the intensity sum normalized by the area or number of camera pixels above a threshold intensity level, or the total intensity of camera pixels above a specified threshold normalized by the area corresponding to the crucible surface corresponding to those pixels.

An estimate of deposition rate could also be used, based on the measurement of intensity level distribution from material surface 27. Using the Langmuir equation, an estimate of the deposition rate can be based on this temperature distribution and the material vapor pressure curve.

The intensity to temperature relationship is described by the gray body radiation equation:

$$I_\lambda = \varepsilon \times \frac{2hc^2\lambda^{-5}}{\exp\left(\frac{hc}{k\lambda T}\right)-1} \times \frac{A^2}{r^2}$$

Where $I_\lambda$ is the intensity at a given wavelength, $\varepsilon$ is the emmisivity of the material, h is Planck's constant, c is the speed of light, $\lambda$ is the wavelength of light, k is the Boltzmann constant, T is the temperature of the material, A is the area of the detector, and r is the distance from the detector to the source material.

Once temperature is derived it can be used in the Langmuir equation to determine evaporation rate:

$$\Phi e = \frac{\alpha_e N_A (P_e - P_h)}{(2\pi MRT)^{1/2}}$$

Where $\Phi_e$ is the evaporation flux in number of atoms (or molecules), $\alpha_e$ is the coefficient of evaporation, $N_A$ is Avogadro's number, $P_h$ is the hydrostatic pressure acting on the evaporant (the chamber pressure), M is the molar mass of the material, R is the universal gas constant, and T is the temperature of the material. $P_e$ is the vapor pressure of the material at the given temperature and can be found by the vapor pressure curve:

$$\log_{10} Pe = -\frac{0.05223a}{T} + b$$

Where $P_e$ is the vapor pressure, T is the temperature of the material in Kelvin, and a and b are material constants.

In addition, a signal could be obtained from a measurement or estimate of the surface temperature distribution, and evaporation rate estimated from the area above a threshold temperature.

Figure 10B:
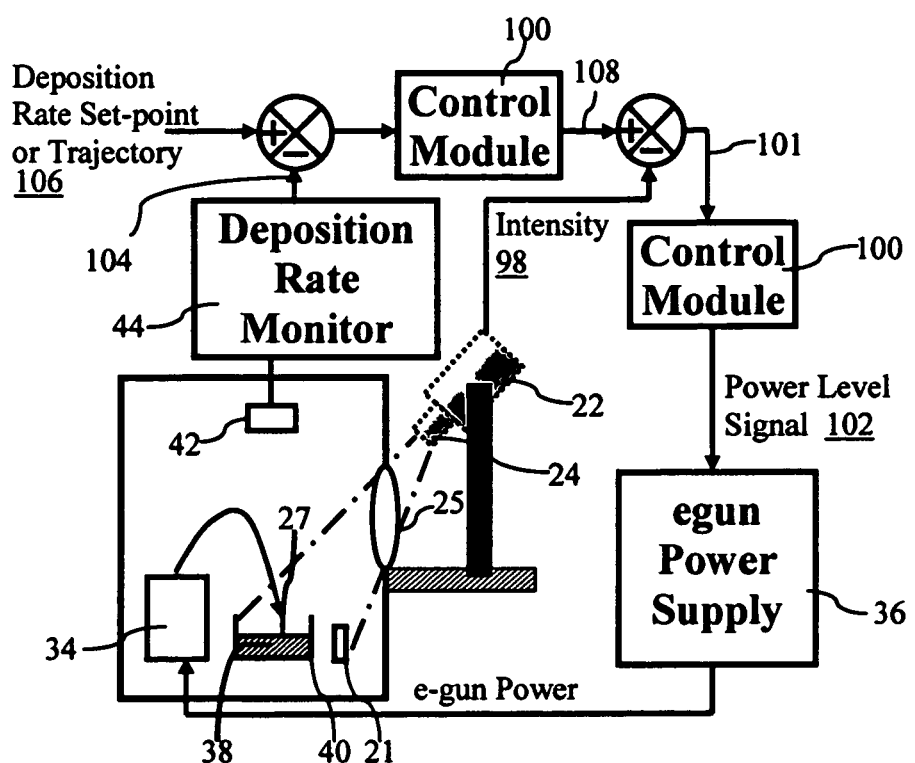
FIG. 10b is a schematic block diagram of the E-beam vision system intensity signal used in a cascaded control scheme with a deposition rate monitor to control e-gun power.

In some cases, a cascaded control structure can also be used to provide real time control of e-gun power to achieve a desire deposition rate. As shown in FIG. 10*b*, the intensity signal 98 is used in an inner loop, and a deposition rate 104 from a traditional monitor 44, such as from a quartz crystal detector, is used to adjust the set-point for the inner loop. Here the actual deposition rate 104 as measured by the deposition rate sensor 44 is compared to the desired deposition rate 106, and an error signal is formed that is used to determine the new intensity set point 108. In this configuration, the outer deposition rate loop acts to determine what intensity signal corresponds to a desired deposition rate, and thus the calibration light 21 and the ICAM 23 are not needed. A control module 100, such as a PID controller, can be used to determine the rate at which set point signal 108 for the intensity level is adapted, as well as to eliminate steady state error. The outer loop can either be used continuously or only at desired time intervals.

Figure 10C:
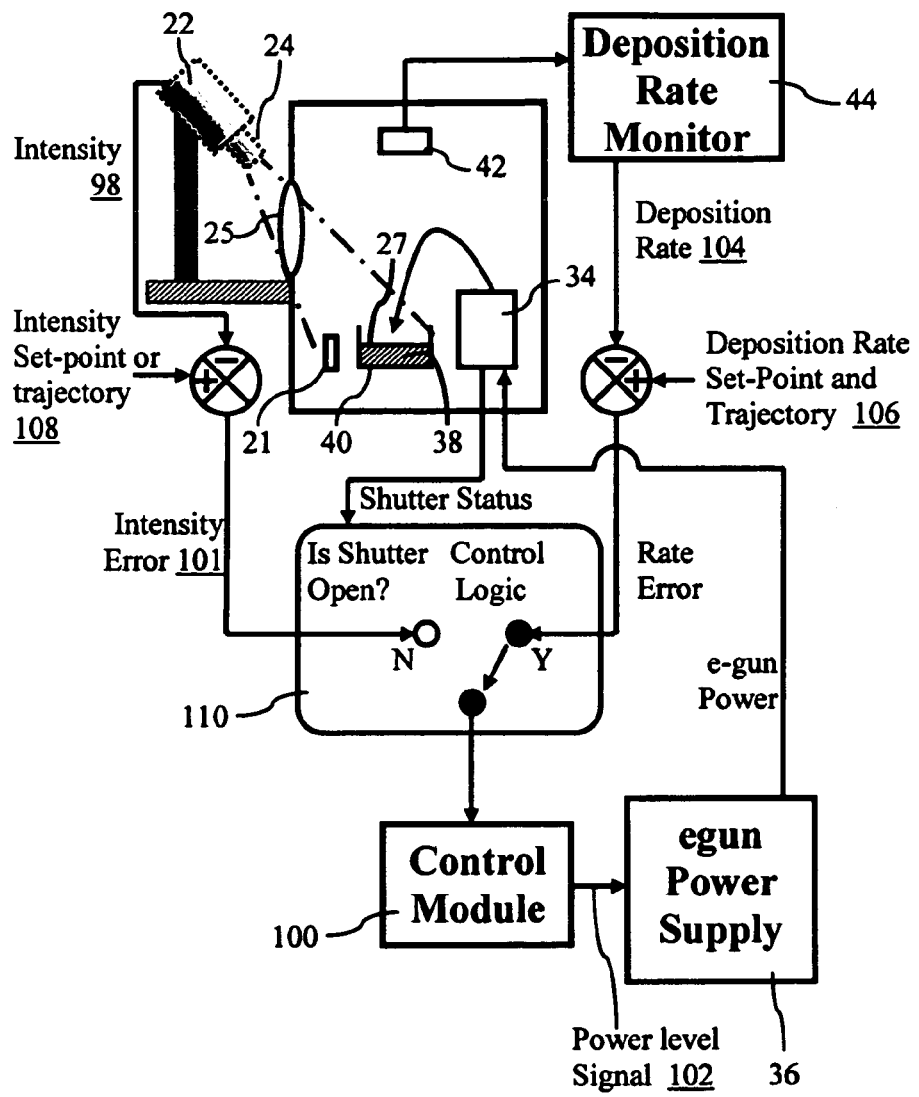
FIG. 10c is a schematic block diagram for control of e-gun power based on either vision system intensity signal or deposition rate monitor depending on shutter position.

Emitted light intensity from the crucible melt surface 27 can also be used to determine evaporation rate and provide feedback to the e-gun control module 100 before the shutter is opened in order to stabilize the initial deposition rate before a traditional sensor 42 would register a signal (FIG. 10*c*). A traditional deposition rate monitor 44, such as a quartz crystal monitor, can then be used after the shutter is opened. In this configuration, software program 110 would be used to determine whether the shutter is closed and the intensity feedback signal 98 would be used for feedback control, or the shutter is open and the deposition rate signal 104 would be fed back to determine the e-gun power level.

These systems described above can be used to adopt the power level used in other applications to maintain a desired intensity or thermal distribution by changing where the input power is directed.

While the disclosed methods and systems have been shown and described in connection with illustrated embodiments, various changes may be made therein without departing from the spirit and scope of the invention as defined in the appended claims.

The invention claimed is:

1. A method of characterizing an electron beam, comprising:
   a. providing a system including an electron gun having a steering coil;
   b. providing a material having a surface;
   c. directing an electron beam from said electron gun to said surface, wherein said directing includes providing a first current to said steering coil to direct said electron beam to a first point on said surface and then providing a second current to said steering coil to direct said electron beam to a second point on said surface;
   d. providing an imaging system mounted for viewing said surface; and
   e. collecting an image based on light emitted from said surface because of said electron beam directed at said first point and said second point and determining a light intensity at said first point and at said second point.

2. A method as recited in claim 1, further comprising adjusting said current in said steering coil based on said image.

3. A method as recited in claim 1, wherein said electron gun has a pair of said steering coils, further comprising sweeping said electron beam across said surface, wherein said sweeping involves adjusting currents in each coil of said pair of said steering coils, further comprising determining light intensity at an array of points on said surface emitted in response to said electron beam.

4. A method as recited in claim 3, further comprising using said light intensity to design an electron beam sweep pattern.

5. A method as recited in claim 3, wherein said imaging system includes a plurality of pixels, further comprising determining a light intensity at each pixel of said imaging system and providing said intensity at each pixel as an array to an image processing system.

6. A method as recited in claim 5, further comprising processing said array with a computer algorithm.

7. A method as recited in claim 3, further comprising adjusting a dwell time at each point of said array of points based on said emitted light intensity measurement.

8. A method as recited in claim 3, wherein said system comprises an evaporation system, wherein said light intensity at each said point is related to evaporation rate.

9. A method as recited in claim 3, further comprising providing a computer algorithm to adjust said electron beam sweep pattern.

10. A method as recited in claim 3, further comprising distortion-correcting said image.

11. A method as recited in claim 3, further comprising analyzing data for a light intensity distribution and calculating a parameter of said light intensity distribution.

12. A method as recited in claim 11, wherein said parameter comprises at least one from the group consisting of centroid position, location of peak intensity, and beam boundary position.

13. A method as recited in claim 3, further comprising sequentially adjusting said current to steer said beam to each of four extreme points on said surface and recording light emitted by said surface said four extreme points.

14. A method as recited in claim 13, further comprising adjusting said current to steer said beam to a center position and imaging said center position from light emitted by said surface.

15. A method as recited in claim 3, further comprising determining a sweep pattern that compensates for non-linear variations in at least one from the group including beam location and beam focus, wherein said sweep pattern includes a sequence of coil currents and dwell times.

16. A method as recited in claim 15, further comprising notifying an operator of a change in light intensity data.

17. A method as recited in claim 3, further comprising obtaining a stable intensity image for an array of coil currents by storing intensity for each pair of coil currents, wherein each pair of coil currents is held for an extended time.

18. A method as recited in claim 17, further comprising at least one from the group including calculating an average intensity, calculating an area of pixels having an intensity above a specified threshold, and calculating a centroid position.

19. A method as recited in claim 18, further comprising perturbing a sweep pattern so said emitted light intensity more closely matches a desired image.

20. A method as recited in claim 17, further comprising calculating an initial dwell time at each coil current based on said stable intensity image and a desired image.

21. A method as recited in claim 20, further comprising calculating an improved dwell time at each coil current based on obtaining an initial dwell time image and providing adjustments in dwell times to more closely match said desired image.

22. A method as recited in claim 3, further comprising providing real time feedback from said imaging system to control deposition rate by adjusting electron flux to more closely match a desired image.

23. A method as recited in claim 1, further comprising at least one from the group including adjusting integration time to extend range of light intensity that can be accepted by said camera and providing light intensity calibration.

24. A method as recited in claim 1, further comprising storing said light intensity and monitoring to determine a change in light intensity beyond a specified limit.

25. A method as recited in claim 1, wherein said material sublimates.

26. A method as recited in claim 1, wherein said imaging system includes a video camera.

27. A method of operating an electron beam, comprising:
   a. providing a system including an electron gun having a steering coil;
   b. providing a material having a surface;
   c. directing an electron beam from said electron gun to said surface,
   d. providing an imaging system mounted for viewing said surface;
   e. collecting an image based on light emitted from said surface because of said electron beam; and
   f. providing real time feedback from said imaging system to control deposition rate by adjusting electron flux so that measured emitted light intensity more closely matches a desired image.

28. A method of operating an electron beam, comprising:
   a. providing a system including an electron gun for operating on a surface, wherein said electron gun has an adjustable input parameter, wherein said surface has a measurable output parameter, wherein adjusting said adjustable input parameter adjusts an operation of the electron gun on the surface, wherein said output parameter is related to intensity of light emitted by the surface;
   b. directing an electron beam from said electron gun to said surface, c. providing a camera for observing the surface;

d. collecting an image of said surface with said camera based on light emitted by the surface;

e. determining intensity level of light in said image; and f. adjusting said input parameter based on said intensity.

29. A method as recited in claim 28, wherein said adjustable input parameter can be independently adjusted for each point of an array of points on the surface, wherein said output parameter has a value for each point of said array of points, wherein said output parameter is related to intensity of light emitted by the surface resulting from said operation to the surface.

30. A method as recited in claim 29, further comprising analyzing intensity levels of said image to provide an array of intensity data corresponding to said array of points.

31. A method as recited in claim 30, further comprising adjusting said input parameter for said points of said array to obtain a desired array of intensity data.

* * * * *